(12) United States Patent
Hong et al.

(10) Patent No.: US 8,376,590 B2
(45) Date of Patent: Feb. 19, 2013

(54) METHOD OF MANUFACTURING A LIGHT EMITTING UNIT AND LIGHT EMITTING DEVICE MANUFACTURED USING THE METHOD

(75) Inventors: Seung-Sik Hong, Ansan-si (KR); Seung-Ryeol Ryu, Ansan-si (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 0 days.

(21) Appl. No.: 12/892,383

(22) Filed: Sep. 28, 2010

(65) Prior Publication Data

US 2011/0235341 A1    Sep. 29, 2011

(30) Foreign Application Priority Data

Sep. 30, 2009    (KR) .......................... 10-2009-0092832

(51) Int. Cl.
*F21V 7/00*    (2006.01)

(52) U.S. Cl. ........ 362/310; 362/267; 362/362; 362/375; 362/631

(58) Field of Classification Search .................. 362/267, 362/310, 362, 375, 630–631
See application file for complete search history.

(56) References Cited

U.S. PATENT DOCUMENTS

| | | | |
|---|---|---|---|
| 2007/0153523 A1* | 7/2007 | Thornhill et al. | 362/276 |
| 2009/0133636 A1* | 5/2009 | Richmond | 119/52.2 |
| 2009/0207596 A1* | 8/2009 | Richmond | 362/159 |

* cited by examiner

*Primary Examiner* — Meghan Dunwiddie
(74) *Attorney, Agent, or Firm* — H.C. Park & Associates, PLC

(57) ABSTRACT

The present invention relates to a method of manufacturing a light emitting unit including mounting at least one light emitting element on a printed circuit board (PCB), connecting at least one terminal to the PCB, the at least one terminal to provide power to the at least one light emitting element, and molding a housing to enclose a light emitting part including the PCB and the at least one terminal.

14 Claims, 4 Drawing Sheets

METHOD OF MANUFACTURING A LIGHT EMITTING UNIT AND LIGHT EMITTING DEVICE MANUFACTURED USING THE METHOD

CROSS REFERENCE TO RELATED APPLICATION

This application claims priority from and the benefit of Korean Patent Application No. 2009-92832, filed on Sep. 30, 2009, which is hereby incorporated by reference for all purposes as if fully set forth herein.

BACKGROUND OF THE INVENTION

1. Field of the Invention

Exemplary embodiments of the present invention relate to a method of manufacturing a light emitting unit and a light emitting device including a light emitting unit manufactured using the method. More particularly, exemplary embodiments of the present invention relate to a method of manufacturing a light emitting unit used for general lighting such as a billboard, a sign, a lamp apparatus, etc., and a light emitting device including a light emitting unit manufactured using the method.

2. Discussion of the Background

Generally, a billboard for outdoors advertisement, etc., widely employs a fluorescent lamp, a neon lamp, etc. Recently, in order to overcome problems of a fluorescent lamp, a neon lamp, etc. that have limited color reproducibility, a lack of durability, and a short lifetime, a light emitting diode (LED) has been used as a billboard light source.

In the billboard having an LED, typically, a plurality of light emitting units including an LED is arranged on the billboard in a letter form so as to display advertisement contents.

The light emitting units for a channel letter are manufactured to be connected to each other by wires of a standard length. Since the wire is electrically connected by solder, etc., many working processes may be required, thereby increasing working time and cost. In addition, when the life of a light emitting unit comes to an end or defects in the light emitting unit occur, it may be inconvenient to replace the light emitting unit with a new one because an electrical connection process by solder, etc. is required.

SUMMARY OF THE INVENTION

Exemplary embodiments of the present invention provide a method of manufacturing a light emitting unit capable of simplifying a process to enhance productivity.

Exemplary embodiments of the present invention also provide a light emitting device including a light emitting unit manufactured using the method.

Additional features of the invention will be set forth in the description which follows, and in part will be apparent from the description, or may be learned by practice of the invention.

An exemplary embodiment of the present invention discloses a method of manufacturing a light emitting unit, the method including mounting at least one light emitting element on a printed circuit board (PCB), connecting at least one terminal to the PCB, the at least one terminal to provide power to the at least one light emitting element, and molding a housing to enclose a light emitting part including the PCB and the terminal.

Another exemplary embodiment of the present invention discloses a light emitting device including a light emitting part including a printed circuit board (PCB) on which at least one light emitting element is disposed and at least one terminal configured to provide power to the at least one light emitting element, and a housing enclosing the PCB and the at least one terminal, the housing including a body portion corresponding to the PCB and a coupling portion protruding from the body portion and enclosing the at least one terminal.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
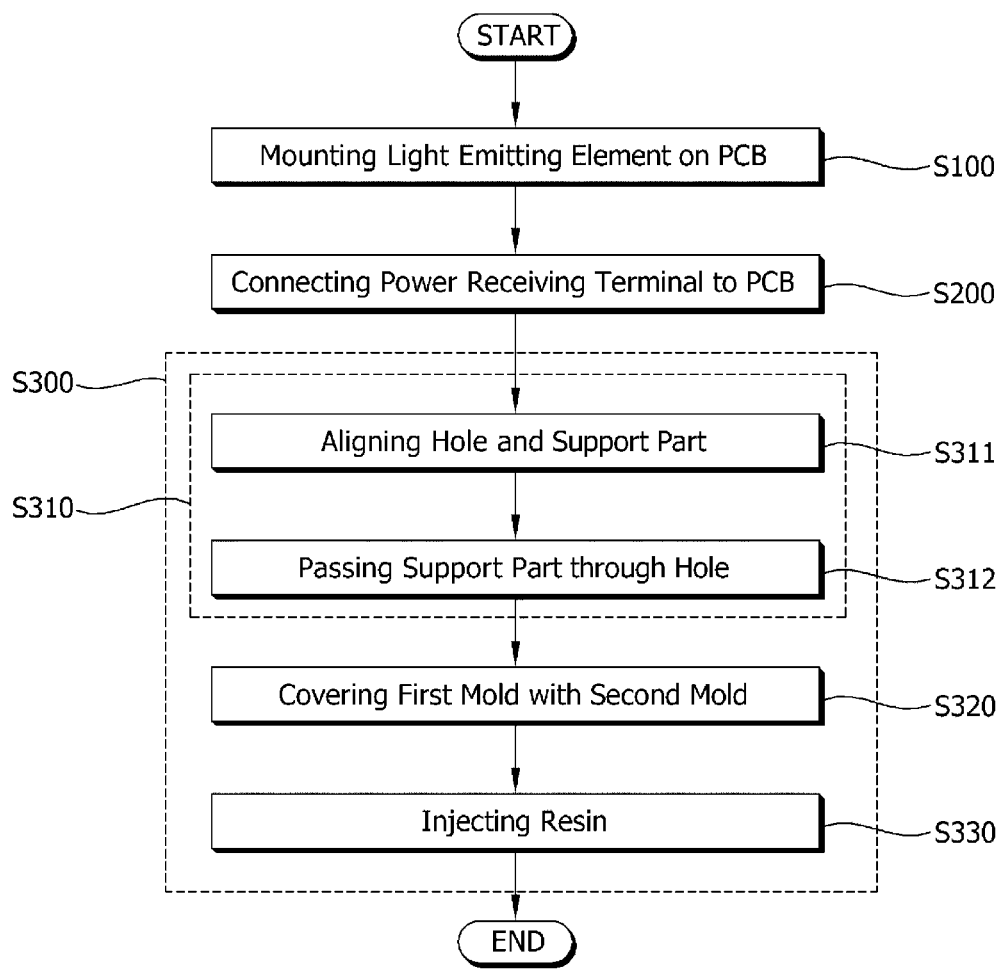
FIG. 1 is a flow chart illustrating a method of manufacturing a light emitting device according to an exemplary embodiment of the present invention.

The present invention is described more fully hereinafter with reference to the accompanying drawings, in which example embodiments of the present invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the invention are described herein with reference to cross-sectional illustrations that are schematic illustrations of idealized example embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments of the present invention will be described in detail with reference to the accompanying drawings.

Figure 2:
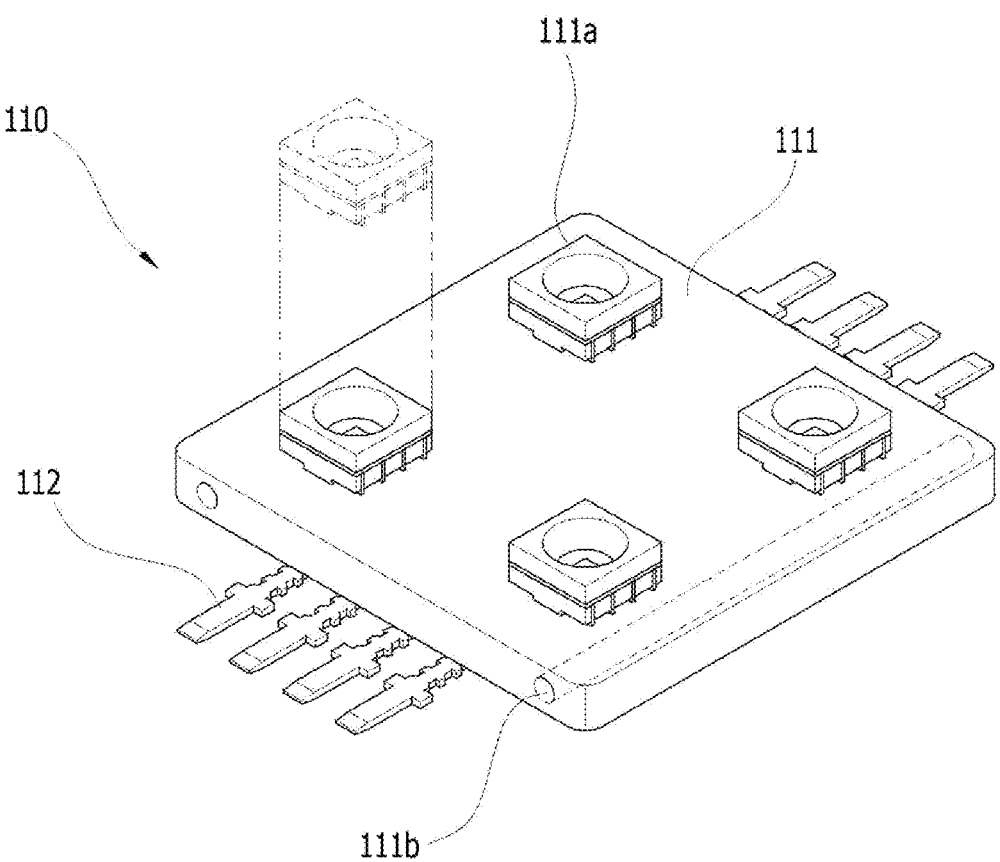
FIG. 2 is a perspective view illustrating a detail structure of a light emitting part in the method shown in FIG. 1.

FIG. 1 is a flow chart illustrating a method of manufacturing a light emitting device according to an exemplary embodiment of the present invention. FIG. 2 is a perspective view illustrating a detail structure of a light emitting part in the method shown in FIG. 1.

Referring to FIG. 1 and FIG. 2, in order to manufacture a light emitting unit, a light emitting element 111a is mounted on a printed circuit board (PCB) 111 in step S100. Then, a terminal 112 is connected to the PCB 111 in step S200. Thereafter, a housing 120 (refer to FIG. 4) is molded to enclose the PCB 111 to which the terminal 112 is connected in step S300.

Hereinafter, the above-mentioned steps will be explained in detail.

Firstly, the light emitting element 111a is coupled to the PCB 111 in step S100. For example, the PCB 111 and the light emitting element 111a may be coupled using a screw, a pin, etc. Alternatively, the light emitting element 111a may be coupled to the PCB 111 using molding resin. A plurality of light emitting elements 111a may be formed on the PCB 111 considering an illumination intensity required for the light emitting unit, and the light emitting elements 111a may be disposed on not only one side of the PCB 111 but both sides of the PCB 111. Thus, mounting the light emitting element 111a on the PCB 111 may be repetitively performed many times using the same method.

Then, the terminal 112 is connected to the PCB 111 in step S200. For example, a lead (not shown) connected to the light emitting element 111a and the terminal 112 may be electrically connected to each other at an end portion of the PCB 111 using solder, etc. For example, the terminal 112 may include a plurality of pins according to the number of the light emitting elements 111a mounted on the PCB 111. Thus, connecting the terminal 112 to the PCB 111 may be repetitively performed many times using the same method.

Thereafter, the housing 120 is molded to enclose a light emitting part 110 including the terminal 112 and the PCB 111 in step S300. For example, the terminal 112 connected to the PCB 111 may have a shape of protruding from the PCB 111, and the housing 120 may be molded to cover the PCB 111 and a portion of the light emitting element 111a and enclose the terminal 112.

Molding methods may include injection molding, aircushion forming, autoclave molding, automatic compression molding, bag molding, clam-shell vacuum forming, compression molding, forming molding, dip molding, casting, etc.

Figure 3:
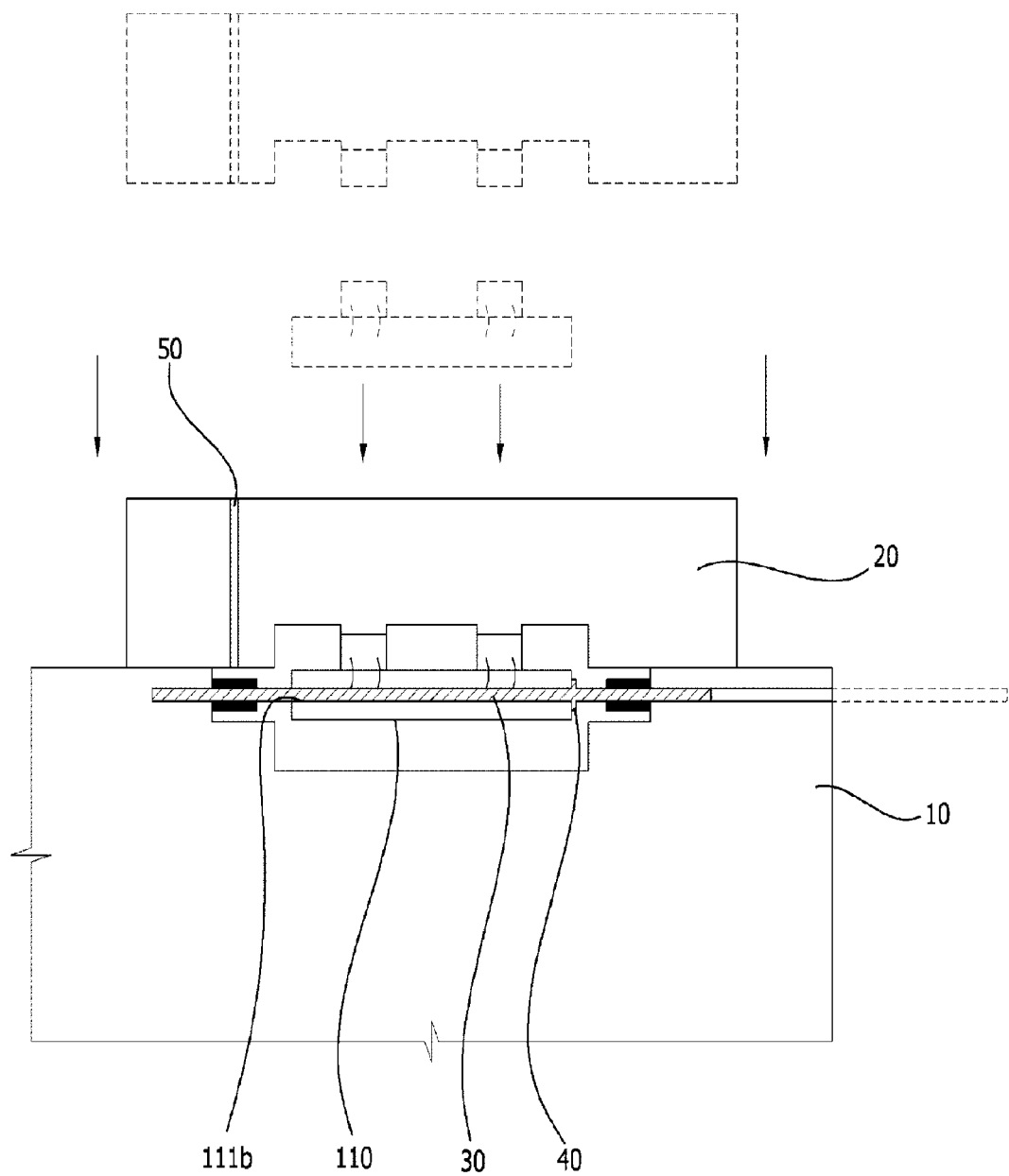
FIG. 3 is a cross sectional view illustrating an exemplary embodiment for a step of molding a housing in FIG. 1.

FIG. 3 is a cross sectional view illustrating an exemplary embodiment for a step of molding a housing in FIG. 1.

Referring to FIG. 3, in the present exemplary embodiment injection molding is used among the possible molding methods described above.

Particularly, the light emitting part 110 is inserted into a first mold 10 having a shape corresponding to a side face of the housing desired to be molded in step S310. The first mold 10 may be horizontally disposed or vertically disposed with respect to the ground, considering a work space.

A hole 111b (see FIG. 2) is formed through the PCB 111 so that the first mold 10 may be spaced apart from the light emitting part 110. The first mold 10 may include a support part 30 passing through the hole 111b and fixing the PCB 111.

In step S310 of inserting the light emitting part 110 into the first mold 10, the hole 111b formed through the PCB 111 is aligned to be coincident with a location of the support part 30 formed at the first mold 10 in step S311, and the support part 30 is passed through the hole 111b in step S312.

The support part 30 protrudes from one side face of the first mold 10 and passes through the PCB 111. The support part 30 may include a fixing protrusion 40 that makes contact with a side of the PCB 111 and fixes the PCB 111, so that length of the support part 30, which is inserted into the other side face of the first mold 10, may be properly determined.

Then, the first mold 10, in which the light emitting part 110 is inserted, is at least partially covered by a second mold 20 in step S320. The second mold 20 has a shape corresponding to an outer face of the housing 120 by coupling the first mold 10.

First, the second mold 20 is aligned corresponding to the first mold 10, and is moved downward toward the first mold 10. The order of aligning the second mold 20 and the first mold 10 and moving the second mold 20 downward may be reversed. Alternatively, aligning the second mold 20 and the first mold 10 and moving the second mold 20 downward may be simultaneously performed.

Then, resin is injected into a space defined by the first mold 10 and the second mold 20 in step S330. The second mold 20 may include a resin injection portion 50 through which the resin is injected into the space. The resin injection portion 50 may be formed at a location opposite to a location at which the fixing protrusion 40 is formed with respect to the light emitting part 110. When the resin is injected through the resin injection portion 50, the resin begins to be filled from a location opposite to a location at which the fixing protrusion 40 is formed with respect to the light emitting part 110. Thus, the resin applies a pressure to the PCB 111 in a direction opposite to a direction in which the resin is filled. The fixing protrusion 40 may fix the PCB 111 to not move against the pressure that the resin applies to the PCB 111.

After the resin is completely filled in the space defined by the first mold 10 and the second mold 20, the support part 30 may be extracted from the space defined by the first mold 10 and the second mold 20 to outside of the first mold 10. Alternatively, when the resin begins to be slowly hardened between the first mold 10 and the second mold 20, the support part 30 may be extracted. Thereafter, after extracting the support part 30, a small amount of resin may be injected into the space defined by the first mold 10 and the second mold 20 to fill an empty space formed by extracting the support part 30.

Then, after completely hardening the resin, the second mold 20 is separated from the first mold 10, and the light emitting unit 100 including the molded housing 120 is separated from the first mold 10.

Figure 4:
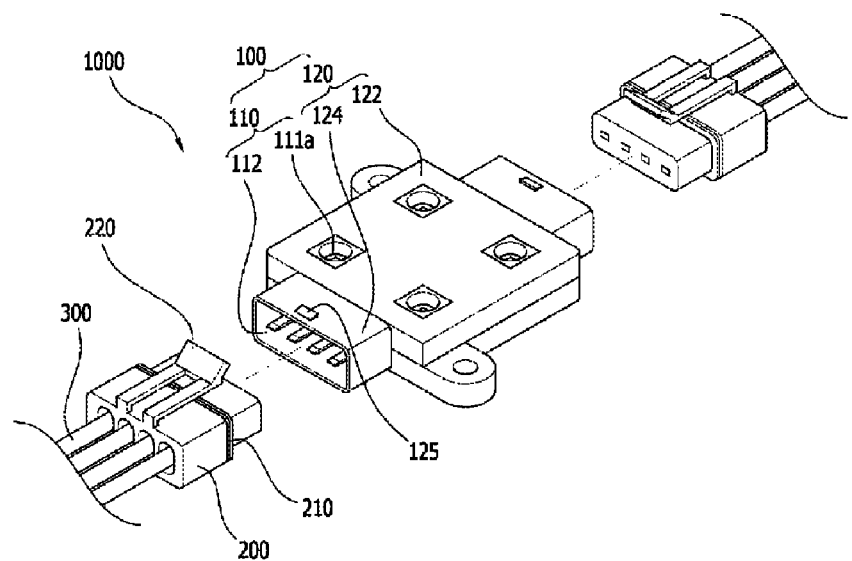
FIG. 4 is an exploded perspective view illustrating a light emitting device including a light emitting unit manufactured by the method in FIG. 1.

FIG. 4 is an exploded perspective view illustrating a light emitting device including a light emitting unit manufactured by the method in FIG. 1.

Referring to FIG. 4, a light emitting device 1000 includes a light emitting unit 100.

The light emitting unit 100 includes a light emitting part 110 and a housing 120.

The light emitting part 110 includes a PCB 111 and a terminal 112. The PCB 111 may include at least one light emitting element 111a. The light emitting element 111a may emit various sorts of light such as white light, red light, etc. In addition, a plurality of light emitting elements 111a may be formed on the PCB 111, considering a desired illumination intensity of the light emitting device 1000, and the light emitting elements 111a may be disposed at a regular interval on the PCB 111.

The terminal 112 is electrically connected to the PCB 111 to provide the light emitting element 111a with power. The terminal 112 may make contact with an end portion of the PCB 111 and be connected to the PCB 111. Thus, the terminal 112 protrudes from the PCB 111. A plurality of terminals 112 may be formed corresponding to the number of the light emitting elements 111a formed on the PCB 111.

The PCB 111 may further include a hole 111b, which is not shown in FIG. 4. The hole 111b may have a shape of passing through the PCB 111. A plurality of holes 111b may be formed through the PCB 111. The hole 111b is provided to fix the PCB 111 to the first mold 10 when molding the housing 120, as described above in FIG. 3. The hole 111b is substantially the same as the hole 111b in FIG. 3, and thus any further description will be omitted.

The housing 120 encloses the PCB 111 and the terminal 112. However, as shown in FIG. 4, the housing 120 may not completely enclose the PCB 111 and the terminal 112. For example, the housing 120 may not enclose a portion at which the light emitting element 111a is formed on the PCB 111. In addition, the housing 120 encloses the terminal 112 and may be formed to be spaced apart from the terminal 112.

The housing 120 may include a body portion 122 and a coupling portion 124. The body portion 122 corresponds to the PCB 111, and may cover at least one of a front face and a rear face of the PCB 111. The coupling portion 124 protrudes from the body portion 122 and encloses the terminal 112.

The light emitting device 1000 may further include a wire connecting member 200. The wire connecting member 200 provides the light emitting part 110 with power. A portion at which the wire connecting member 200 makes contact with the terminal 112 and the housing 120 may have a shape corresponding to a space between the terminal 112 and the housing 120. Thus, the wire connecting member 200 may be detachably coupled to the terminal 112 and the housing 120 between the terminal 112 and the housing 120.

The wire connecting member 200 may include a waterproof member 210. The waterproof member 210 may prevent water from penetrating after the wire connecting member 200 is inserted between the terminal 112 and the housing 120. A shape of the waterproof member 210 may be changed, and the waterproof member 210 may include a material having elasticity.

Figure 5:
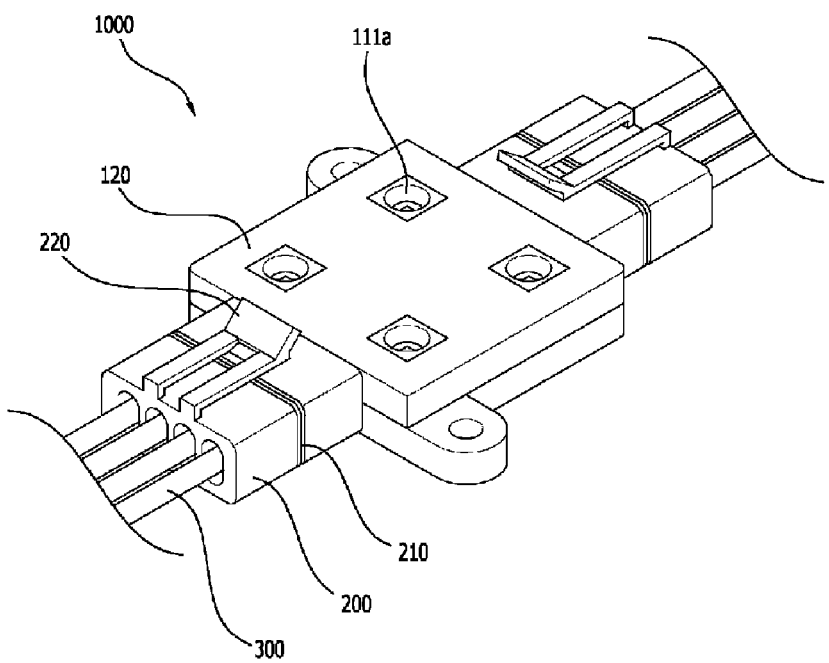
FIG. 5 is a perspective view illustrating the light emitting device illustrated in FIG. 4.

FIG. 5 is a perspective view illustrating the light emitting device illustrated in FIG. 4.

Referring to FIG. 5, a plurality of light emitting devices 1000 may be connected to each other by the wire connecting member 200. The light emitting device 1000 may further include a wire 300 electrically connected to the wire connecting member 200. The light emitting device 1000 enables shapes or typefaces of letters to be controlled by adjusting length of the wire 300.

The wire connecting member 200 may further include a protrusion 220 that slides over and engages a notch 125 on the coupling portion 124. The protrusion 220 may be a flexible protrusion, such as shown in FIG. 5, which includes a bent portion that may be used to lift the protrusion 220 away from the wire connecting member 200 and the coupling portion 124, and thereby disengage the protrusion 220 from the notch 125.

As described above, according to a method of manufacturing a light emitting unit of the present invention, a housing enclosing a portion with which a light emitting part and a wire connecting member make contact is molded to enhance productivity of the light emitting unit.

In addition, a hole is formed through a PCB of the light emitting unit, and a support part including a fixing protrusion that passes through the hole and fixes the PCB at a predetermined location, is formed at a mold, thereby more accurately forming a shape of the housing.

According to a light emitting device of the present invention, when manufacturing a billboard using a channel letter, a length of a wire may be adjusted to easily form a shape of the channel letter desired to be displayed. In addition, when the life of a light emitting device comes to an end or defects in the light emitting device occur, the light emitting device of the present invention may be easily replaced.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of manufacturing a light emitting unit, the method comprising:
   mounting at least one light emitting element on a printed circuit board (PCB);
   connecting at least one terminal to the PCB, the at least one terminal to provide power to the at least one light emitting element; and
   molding a housing to enclose a light emitting part comprising the PCB and the at least one terminal.

2. The method of claim 1, wherein molding the housing comprises:
   inserting the light emitting part into a first mold comprising a shape corresponding to a side face of the housing;
   coupling the first mold and a second mold, thereby defining a space between the first mold and the second mold, the second mold comprising a shape corresponding to an outer face of the housing; and
   injecting resin into the space defined by the first mold and the second mold.

3. The method of claim 2, further comprising:
   forming a hole through the PCB,
   wherein the first mold comprises a support part to fix the inserted light emitting part, and wherein inserting the light emitting part into the first mold comprises:
   aligning the hole to be coincident with the support part; and
   passing the support part into the hole.

4. The method of claim 3, wherein the support part comprises a fixing protrusion to contact a side face of the PCB, and
   wherein the resin is injected into the space defined by the first mold and the second mold, at a location opposite to a location at which the fixing protrusion is formed with respect to the light emitting part.

5. A light emitting device, comprising:
   a light emitting part comprising a printed circuit board (PCB) on which at least one light emitting element is disposed and at least one terminal configured to provide power to the at least one light emitting element; and
   a housing enclosing the PCB and the at least one terminal, the housing comprising a body portion corresponding to the PCB and a coupling portion protruding from the body portion and enclosing the at least one terminal.

6. The light emitting device of claim 5, further comprising:
   a wire; and
   a wire connecting member detachably coupled to the housing,
   wherein the wire is electrically connected to the at least one terminal via the wire connecting member.

7. The light emitting device of claim 6, wherein the wire connecting member comprises a waterproof member arranged on a portion thereof, the waterproof member directly contacting the housing.

8. The light emitting device of claim 5, wherein the light emitting part comprises a first terminal and a second terminal.

9. The light emitting device of claim 8, wherein the first terminal and the second terminal are arranged on opposite sides of the PCB.

10. The light emitting device of claim 8, wherein the first terminal and the second terminal are arranged on adjacent sides of the PCB.

11. The light emitting device of claim 6, wherein the light emitting part comprises a first terminal and a second terminal, and
    wherein a second wire connecting member is detachably coupled to a side of the housing other than a side to which the wire connecting member is detachably coupled, and a second wire is electrically connected to the second terminal via the second wire connecting member.

12. The method of claim 1, wherein the housing comprises a body portion corresponding to the PCB and a coupling portion protruding from the body portion and enclosing the at least one terminal.

13. The method of claim 1, wherein the at least one light emitting element is mounted directly on a surface of the PCB.

14. The light emitting device of claim 5, wherein the at least one light emitting element is disposed directly on a surface of the PCB.

* * * * *